United States Patent
Sano et al.

(10) Patent No.: US 7,608,205 B2
(45) Date of Patent: Oct. 27, 2009

(54) DECENTRALIZED SOLUTION OF MICROSCOPIC PARTICLES AND CIRCUIT FORMATION DEVICE

(75) Inventors: Yuichiro Sano, Mito (JP); Toru Miyasaka, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 242 days.

(21) Appl. No.: 11/529,263

(22) Filed: Sep. 29, 2006

(65) Prior Publication Data

US 2007/0159157 A1 Jul. 12, 2007

(30) Foreign Application Priority Data

Dec. 26, 2005 (JP) ............................. 2005-371282

(51) Int. Cl.
*H01B 1/00* (2006.01)
(52) U.S. Cl. ........................ 252/514; 156/230; 428/332; 424/490; 430/87; 523/106; 523/402; 524/22
(58) Field of Classification Search ................ 252/500; 156/230; 428/332; 430/87; 523/106, 402; 524/22; 75/255; 361/524; 423/604, 605; 429/34; 424/490
See application file for complete search history.

(56) References Cited

U.S. PATENT DOCUMENTS

| | | | | |
|---|---|---|---|---|
| 3,723,115 A | * | 3/1973 | Miyatsuka | 430/87 |
| 5,788,991 A | * | 8/1998 | Nastke et al. | 424/490 |
| 5,891,598 A | * | 4/1999 | Miyabe et al. | 428/332 |
| 5,958,168 A | * | 9/1999 | Liu et al. | 156/230 |
| 6,200,680 B1 | * | 3/2001 | Takeda et al. | 428/402 |
| 6,284,819 B1 | * | 9/2001 | Darsillo et al. | 524/22 |
| 6,391,084 B1 | * | 5/2002 | Ito et al. | 75/255 |
| 7,226,573 B2 | * | 6/2007 | Harigae et al. | 423/604 |
| 2002/0055557 A1 | * | 5/2002 | Morita et al. | 523/402 |
| 2003/0129471 A1 | * | 7/2003 | Kitade et al. | 429/34 |
| 2004/0037023 A1 | * | 2/2004 | Kabe et al. | 361/524 |
| 2005/0072270 A1 | * | 4/2005 | Kato et al. | 75/255 |
| 2005/0282929 A1 | * | 12/2005 | Beach et al. | 523/160 |
| 2006/0018821 A1 | * | 1/2006 | Suzuki et al. | 423/605 |
| 2006/0058420 A1 | * | 3/2006 | Yatake | 523/160 |

FOREIGN PATENT DOCUMENTS

| | | | |
|---|---|---|---|
| JP | 11-186005 | * | 7/1999 |
| JP | 2003-288812 A | | 10/2003 |
| JP | 2006-206730 | * | 8/2006 |

* cited by examiner

*Primary Examiner*—Mark Kopec
*Assistant Examiner*—Khanh Tuan Nguyen
(74) *Attorney, Agent, or Firm*—McDermott Will & Emery LLP

(57) ABSTRACT

Microscopic particle decentralized solution having microscopic particles with different diameters are decentralized, wherein: the microscopic particle decentralized solution has two peaks in a granularity distribution, at a large diameter and a small diameter; and microscopic particle mixtures satisfying the following relationships are decentralized in the solution;

$$R>r \text{ and } n>3.84\times(R/r)^3\times N,$$

where R is a large particle diameter, r is a small particle diameter, N is the number of large particles, and n is the number of small particle.

5 Claims, 3 Drawing Sheets

DECENTRALIZED SOLUTION OF MICROSCOPIC PARTICLES AND CIRCUIT FORMATION DEVICE

CLAIM OF PRIORITY

The present application claims priority from Japanese application serial no. 2005-371282, filed on Dec. 26, 2005, the content of which is hereby incorporated by references into this application.

BACKGROUND OF THE INVENTION

1. Field of Technology

The present invention relates to a decentralized solution of microscopic particles including nano-particle clusters and to a circuit formation device by using the decentralized solution of microscopic particles.

2. Background of Art

A conventional general method of forming arbitrary conductive patterns on a circuit board or the like is a method in which lithography technology, etching technology, and plating technology are combined. This method requires a mask for exposure that needs much time in designing and preparation as well as advanced machining technique. In addition, since a series of processes are complex, a long preparation time is needed, resulting in a high cost. If it becomes necessary to modify the mask in, for example, limited production of a wide variety of products, a high cost, delayed delivery, and other problems occur. The use of large quantities of materials hazardous to the environment, such as resists and etching solutions, is indispensable, so extra costs have been needed in management and processing of waste materials.

In other proposed conductive pattern forming methods in which processes are simple, printing processes that use a conductive microscopic particle decentralized solution, in which conductive microscopic particles, binder resin, and other materials are decentralized in a solvent, are used; the printing processes include a screen printing process, a dispenser printing process, an ink jet printing process, and an electrophotography process. These methods achieve simple processes because of less steps, use less materials, and produces less waste materials, so they are expected as processes that greatly reduces costs.

In the printing processes in which conductive patterns are formed by using a conductive microscopic particle decentralized solution in which conductive microscopic particles are decentralized, however, distances among microscopic particles in the conductive microscopic particle decentralized solution become large. As a result, when conductive wires are formed by, for example, heating, many voids are generated and thereby the wires become more resistive and are weakened in strength. To reduce the heating temperature when wires are formed, nano-scale microscopic particles having a property for reducing a melting point may be used in the conductive microscopic particle decentralized solution used in the printing process. In this case, however, the primary particle diameters of the above nano-scale microscopic particles are small, so the thickness of a film formed in one printing is small. To achieve the desired wire film thickness, films have to be laminated by repeating patterning, which may reduce the productivity.

To address these problems, a method was studied in which clustered conductive microscopic particles, for example, are used to reduce the resistance by shortening the distances among the conductive microscopic particles in advance (Patent Document 1).

Patent Document 1: Japanese Application Patent Laid-open Publication No. 2003-288812

SUMMARY OF THE INVENTION

Problems to be Solved by the Invention

Even if the clustered conductive microscopic particles shown in Patent Document 1 are used, there are still problems; the resolution of a wire pattern obtained from microscopic particles having larger diameters is lowered, and the ratio of voids in the pattern is increased due to the larger microscopic diameters so that a thickness of a film is reduced after heating and fusing.

The present invention addresses these problems with the object of providing a conductive microscopic particle decentralized solution that enables the forming of low-resistance patterns with thick films at high speed and at low heating temperature, without reducing the resolution.

To achieve the above object, instead of using a conductive microscopic particle decentralized solution in which only microscopic particle clusters decentralize, as in conventional methods, the present invention uses a conductive microscopic particle decentralized solution which has two granularity distribution peaks satisfying the following relationships; $R>r$ and $n>3.84\times(R/r)^3\times N$, where R is a large particle diameter (of a microscopic particle cluster), r is a small particle diameter (of a microscopic particle), N is the number of large particles, and n is the number of small particle.

When a conductive microscopic particle decentralized solution according to the present invention is used in a printing process, a fine, low-resistance conductive pattern with a high thickness is obtained at high speed and at low heating temperature, without lowering the resolution.

DETAILED DESCRIPTION OF THE INVENTION

An embodiment of the present invention will be described below in detail.

Figure 1:
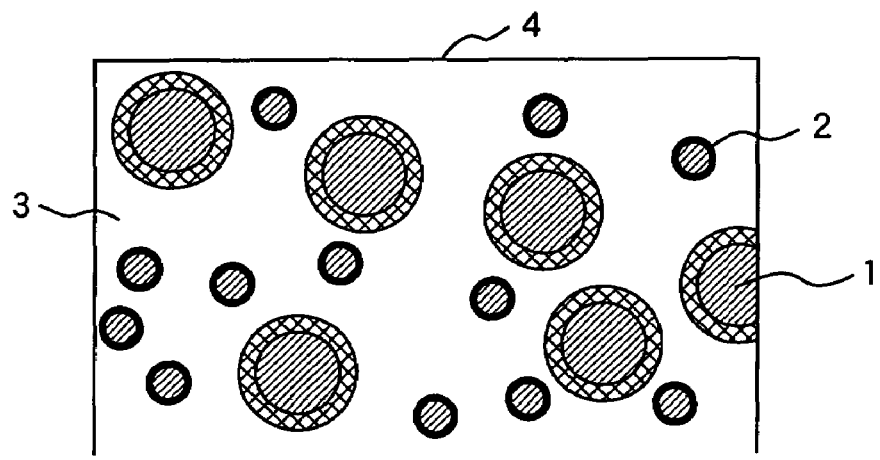
FIG. 1 schematically shows a conductive microscopic particle decentralized solution, including clusters, according to the present invention.

FIG. 1 shows a form of a conductive microscopic particle decentralized solution 4 proposed in the present invention. As shown in FIG. 1, in the conductive microscopic particle decentralized solution 4 proposed by the present invention, large-diameter particles 1 and small-diameter particles 2 decentralize concurrently in a decentralized solution 3. That is, the conductive microscopic particle decentralized solution 4 has two peaks in its granularity distribution, at a large diameter and a small diameter. The large-diameter particles 1 contribute to obtaining a higher thickness and increasing a pattern forming speed in conductive pattern formation, and the small-diameter particles 2 contribute to lowering the resistance of the conductive pattern and increasing the strength thereof in conductive pattern formation because the resolution is increased and the density of the conductive pattern is increased by filling voids generated by deposited large-diameter particles 1.

When the diameter of a large-diameter particle 1 in the inventive conductive microscopic particle decentralized solution 4 is R, and the diameter of a small-diameter particle 2 is r, the following relational expression (1) holds.

$$R > r \tag{1}$$

When the number of large-diameter particles 1 is N, and the number of small-diameter particles 2 is n, if the following relational expression (2) is satisfied, the number of voids in a formed pattern is minimized.

$$n > 3.84 \times (R/r)^3 \times N \tag{2}$$

Assuming that all particles are spherical, the relational expression (2) represents a condition for the number n of small-diameter particles 2 required to fill, with small-diameter particles 2, 24% of the voids generated when large-diameter particles 1 are supplied with a maximum filling factor so as to further lower the density.

The diameter r of the small-diameter particle 2 is preferably smaller than the diameter R of the large-diameter particle 1 by at least one order of magnitude.

Figure 2:
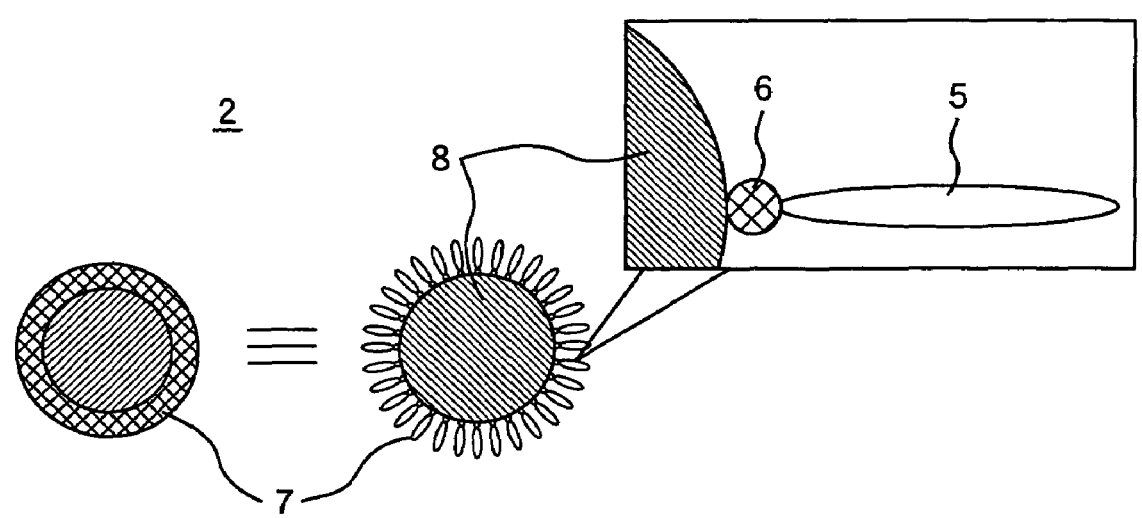
FIG. 2 schematically shows a conductive particle having low-molecular weight organic molecules shown in FIG. 1.

FIG. 2 shows details of the small-diameter particle 2 in the inventive conductive microscopic particle decentralized solution 4 shown in FIG. 1. The diameter of the inventive small-diameter particle 2 is 100 nm or less so as to provide a melting point lowering property and achieve a high resolution. To enable fusion by heating at a temperature of 200° C. or below, the diameter is preferably 10 nm or less. To form a conductive pattern with a line width of 100 nm or less, the diameter is further preferably 5 nm or less.

On the surface of a small-diameter particle nucleus 8, a decentralizer layer 7 is formed to prevent excessive clustering. When the decentralizer 7 comprises a high polymer, the high polymer is a homopolymer or copolymer of styrene or its replacement body, such as polystyrene, poly-p-chlorstyrene, polyvinyl toluene, a styrene-p-chlorstyrene copolymer, or a styrene-vinyl toluene copolymer; a copolymer obtained from styrene and acrylic ester, such as a styrene-methyl acrylate copolymer, styrene-ethyl acrylate copolymer, or styrene-n-butyl acrylate copolymer; a copolymer obtained from styrene and methacrylic ester, such as styrene-methyl methacrylate copolymer, styrene-ethyl methacrylate copolymer, or styrene-n-butyl methacrylate copolymer; a multi-dimensional copolymer obtained from styrene, acrylic ester, and methacrylic ester; another styrene-based copolymer obtained from styrene and another vinyl-based monomer, such as styrene-acrylic nitrile copolymer, styrene-vinyl methyl ether copolymer, styrene-butadiene copolymer, styrene-vinyl methyl ketone copolymer, or styrene-ester maleate; or single or mixed high-polymer resin with a carboxylic acid group, an amino acid group, or another functional group to which ionicity can be added, the resin being, for example, methacrylic ester resin such as polymethyl methacrylate or polybutyl methacrylate, acrylic ester resin such as methyl polyacrylate, ethyl polyacrylate, or butyl polyacrylate, polyester resin, epoxy resin, or a cycloolefin copolymer.

A low-molecular weight organic molecule 5 is, for example, an aliphatic carboxylate inorganic salt that consists of the low-molecular weight organic molecule 5 and an inorganic ion 6 such as Ag, Cu, Au, Pd, Pt, Ni, W, Mo, or Cr, the aliphatic carboxylic acid being dicarboxylic acid such as oxalic acid, malonic acid, succinic acid, adipic acid, glutaric acid, 2,4-diethyl glutaric acid, pimelic acid, azelaic acid, sebacic acid, cyclohexane dicarboxylic acid, maleic acid, fumaric acid, or diglycolic acid, fatty acid such as caprylic acid, lauric acid, myristic acid, palmitic acid, stearin acid, arachidic acid, behenic acid, linolic acid, oleic acid, or linolenic, acid, or hydroxycarboxylic acid such as lactic acid, hydroxy pivalic acid, dimethylol proprionic acid, citric acid, malic acid, or glyceric acid. If the amount of organic molecules in the conductive pattern is reduced to obtain a low resistance and heating is performed at a low temperature to form a conductive pattern on a resin board such as a polyimide board, the latter low-molecular weight organic molecule 5 is preferably used, as shown in FIG. 2.

Figure 3:
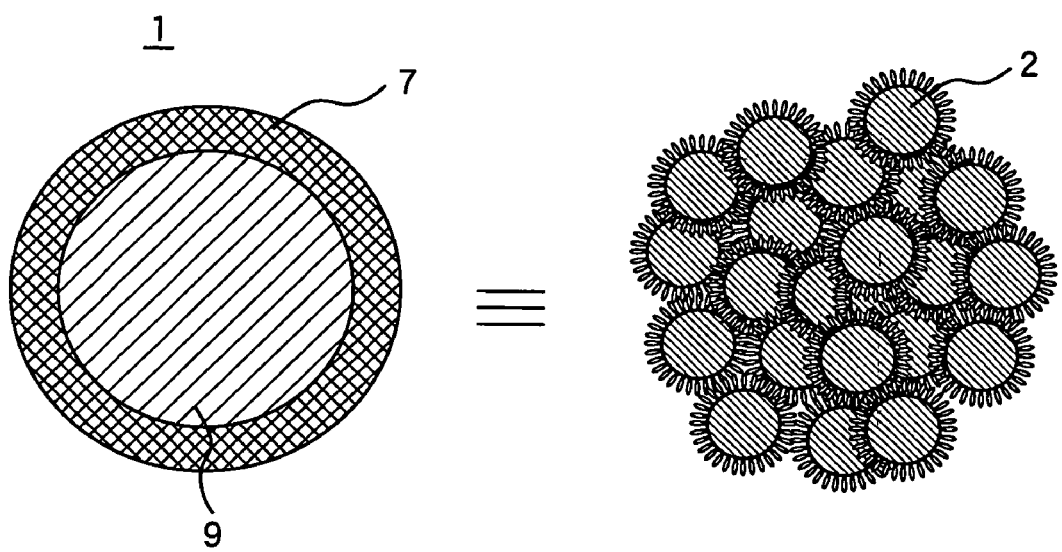
FIG. 3 schematically shows a large-diameter particle which is a cluster of small-diameter particles shown in FIG. 1.
Figure 4:
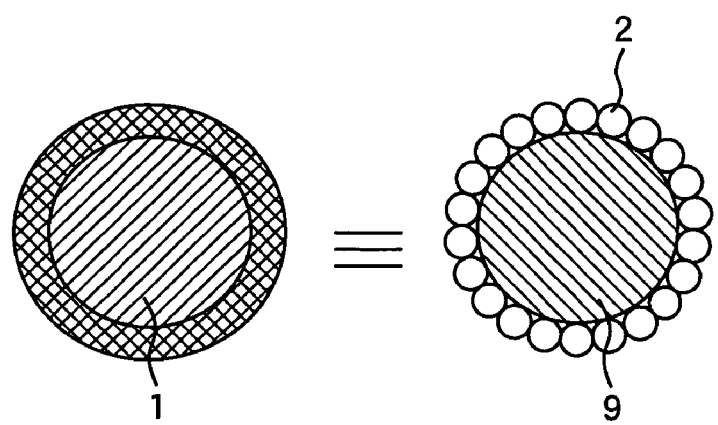
FIG. 4 schematically shows a large-diameter particle having a layer of small-diameter particles on the surface shown in FIG. 1.

FIG. 3 shows details of the large-diameter particle 1 in the inventive conductive microscopic particle decentralized solution 4 shown in FIG. 1. The inventive large-diameter particle 1 is a cluster in which two or more small-diameter particles 2 are aggregated so as to maintain the low-melting point property, as shown in the figure to the right. A decentralizer 7 is applied to the surface of each small-diameter particle 2. Since the decentralizer 7 may be applied uniformly or nonuniformly, small-diameter particles 2 having a nonuniformly applied decentralizer 7 aggregate, resulting in a cluster of small-diameter particles 2. Accordingly, an extremely large number of clusters are not formed. In addition to a cluster of small-diameter particles, a structure in which small-diameter particles 2 are attached to the surface of a bulky large-diameter particle nucleus 9 to form a layer, as shown in FIG. 4, is also allowed. In this case, the diameter of the large-diameter particle 1 is preferably 10 μm or less to achieve wiring in the order of micrometers.

In the present invention, the large-diameter particle nucleus 9 of each large-diameter particle 1 and the small-diameter particle nucleus 8 of each small-diameter particle 2 may be a single metal such as Ag, Cu, Au, Pd, Pt, Ni, W, Mo, or Cr, its oxide, or its alloy. When a conductive body is formed, however, Ag or Cu, which has a low volume resistivity, is preferably used. A mixture of conductive particles described above may be used.

Any type of decentralized solution may be used as the decentralized solution 3 in the present invention if microscopic particles can be stably decentralized in the decentralized solution. To achieve quick evaporation, however, the boiling point of the decentralized solution is preferably 250° C. or less. When the decentralized solution 3 is used for electrophotography, the solvent of the decentralized solution 3 must be a nonpolar solvent so that an electrostatic latent image 14 is not deleted. The nonpolar solvent is preferably an aliphatic hydrocarbon solvent such as, for example, isoparaffin, petroleum naphtha, Isopar from Exxon, IP Solvent from Idemitsu Kosan, Soltol from ConocoPhillips, or another hydrocarbon.

Next, a circuit formation device using static electricity will be described as an example of the inventive circuit formation device using the conductive microscopic particle decentralized solution 4.

Figure 5:
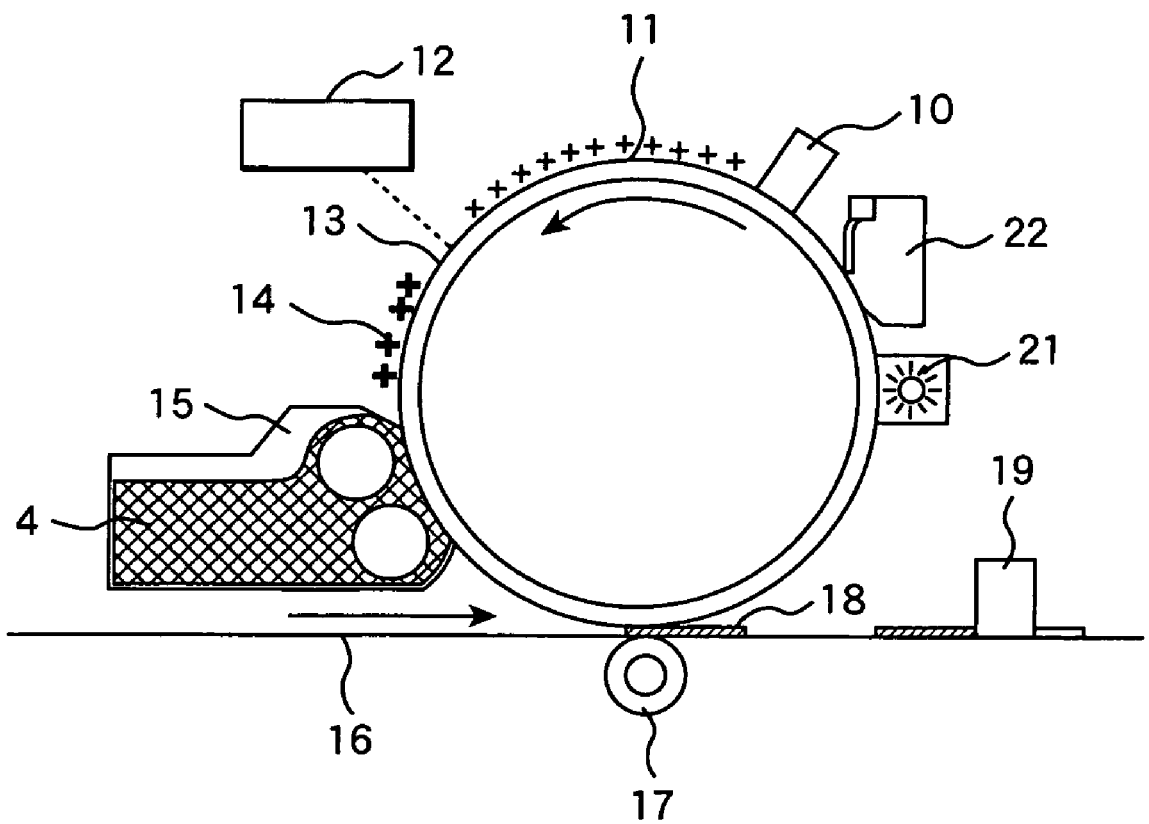
FIG. 5 schematically shows an embodiment of a circuit formation device according to the present invention.

FIG. 5 schematically shows a circuit formation device provided according to the present invention. The device mainly comprises a photosensitive body having a dielectric thin film 13 on the outer periphery of a metal drum, a charging device 10 for uniformly charging the dielectric thin film 13 on the outer periphery side of the photosensitive body, an exposure device 12 for forming an electrostatic latent image on the uniformly charged dielectric thin film, a developing device 15 including the conductive microscopic particle decentralized solution 4 used to develop the electrostatic latent image, a transferring device 17 for transferring the developed image to a board 16, and a heating device 19 for fixing the image, which has been transferred onto the board 16, onto the board. To remove the conductive particles left on the photosensitive drum after the transfer, there are also provided an eraser (remaining charge eliminating device) 21 for eliminating the charges on the conductive particles as well as a cleaning device 22 equipped with a blade, blush, or the like for scraping the conductive particles from which the charges have been removed.

A device for forming an electrostatic latent image 11 according to the present invention uses a dielectric thin film 13 having a photosensitive property; the charging device 10 based on corotron charging, roller contact charging, brush contact charging, or the like is used to uniformly charge the surface of the dielectric thin film, as indicated by 11 in the figure. Then, the exposure device 12, which scans laser beams according to image signals from an image information processing device such as a personal computer, emits light to an arbitrary part so as to form a desired electrostatic latent image 14. As another method, stamp charging is performed to form a desired electrostatic latent image 14; in this method, static charges are applied to a convex part of a transferred electrostatic latent image, on the surface of which a desired pattern is formed in advance, and the convex part is brought into contact with the surface of the dielectric thin film 13. To allow a conductive pattern (electrostatic latent image) to be modified easily, however, the former method, in which uniform charging is performed as indicated by 11 in the figure and the surface is exposed to form an electrostatic latent image 14, is preferable. In both methods, either positive charges or negative charges may be applied.

The inventive developing device 15 develops a conductive pattern by supplying the conductive microscopic particle decentralized solution 4 to the electrostatic latent image 14 so that the conductive microscopic particle decentralized solution is brought into contact with the electrostatic latent image. The developing device 15 comprises a tank for storing the conductive microscopic particle decentralized solution 4 and a supplying device (two pairs of developing rolls are provided in the figure) for supplying the conductive microscopic particle decentralized solution to the electrostatic latent image 14 on the dielectric thin film 13. A device for adjusting the concentration of the conductive microscopic particle decentralized solution 4 is preferably provided in the storage tank, which adjusts the concentration by adding the decentralized solution 3 or conductive particles according to concentration information obtained from a concentration detecting device for detecting the concentration of the conductive microscopic particle decentralized solution 4.

The conductive microscopic particle decentralized solution 4 includes the large-diameter particles 1, so the large-diameter particles 1 may settle down. Since the settling causes a concentration gradient in the storage tank, the relational expression (2), which the microscopic particles must satisfy in the conductive microscopic particle decentralized solution 4, may not be satisfied. To prevent this, the tank storing the conductive microscopic particle decentralized solution 4 preferably has a mixing device for preventing settling and uniforming the concentration over the entire area. The mixing device may be, for example, a device for performing mixing by generating convection in liquid by use of an ultrasonic wave emitting mean, a device for mechanically mixing the liquid, or a device for vibrating the storage tank itself for mixing purposes. If the above device is provided, the conductive microscopic particle decentralized solution 4 supplied to the developing section can maintain the relational expression (2) that has been set at the initial stage. Accordingly, a similar ratio can also be maintained when a pattern is formed at the time of adhesion to the electrostatic latent image 14.

The supplying device for supplying the conductive microscopic particle decentralized solution 4 may use, for example, a method by which a layer of the conductive microscopic particle decentralized solution 4 is formed on a roll and the layer is brought into contact with the electrostatic latent image 14, a method in which a nozzle is used to spray the conductive microscopic particle decentralized solution 4, or a method by which the dielectric thin film 13, on which the electrostatic latent image 14 is formed, is dipped in a tank including the conductive microscopic particle decentralized solution 4.

The inventive circuit formation device has a transfer device 17 for transferring a conductive particle pattern 18 developed on the dielectric thin film 13 to the board 16. The transfer to the board 16 may be performed after the conductive particle pattern 18 has been transferred to an intermediate transfer body. In this case, the board 16 on which to transfer the conductive particle pattern 18 needs to be insulative.

The inventive circuit formation device has a heating device 19 for fixing a conductive particle pattern 18, which has been transferred onto the board 16, on the board 16 so as to form a conductive pattern. Preferably, the heating device 19 can not only bond the conductive particles by fusion but can also bake the decentralizer layer 7 on the conductive layer surface. A function may also be provided which can pressurize the conductive particle pattern 18 on the board 16 while it is being heated. The temperature during pressurizing is preferably 300° C. or less so as to sufficiently bond the conductive particles by fusion and bake ionic organic molecules and to prevent the board 16 from being deformed or denatured. An exhausting device for exhausting baked organic components may be provided.

The inventive circuit formation device may have a drying device for evaporating the solvent component remaining in the conductive particle pattern 18 by drying the solvent component. Furthermore, the evaporated solvent may be liquefied and returned to the developing device 15 so that the solvent can be recycled as a decentralized solution 3 used to reduce the concentration of the conductive microscopic particle decentralized solution 4.

In the inventive circuit formation device, the dielectric thin film 13 may be such that after the conductive particle pattern 18 is transferred, a latent image is formed again to develop the conductive particle pattern 18. The shape is preferably a belt shape or a drum shape. In this case, the circuit formation device preferably has a remaining charge eliminating device 21 for deleting electrostatic latent images remaining on the dielectric thin film 13 and deleting remaining charges from remaining charged particles as well as a remaining conductive particle cleaning device 22 for removing and collecting remaining conductive particles. The remaining conductive particle cleaning device 22 may use, for example, a method in which a blade is brought into contact with the dielectric thin film 13 to scrap the remaining conductive particles or a method in which the remaining conductive particles are washed out. The conductive particles removed and collected may be recycled by being returned to the developing device 15 and decentralized again in the conductive microscopic particle decentralized solution 4.

In addition to the above device using electrophotography, the circuit formation device using the inventive conductive microscopic particle decentralized solution 4 can be applied to printing processes such as a letterpress printing, a surface printing, a copperplate printing, a screen printing, a nanoimprinting, an inkjet printing, and a dispenser printing. The inventive conductive microscopic particle decentralized solution 4 not only can be used to form a pattern as described above, but also can be used in a process for forming a conductive film that is solid over the entire surface by being applied by a roll coater, a spin coater, or a spray.

A conductive pattern formed by the inventive conductive microscopic particle decentralized solution 4 may be used as wiring on a board in, for example, a personal computer, a large-scale electric computer, a notebook personal computer, a pen-based personal computer, a notebook word processor, a mobile phone, a mobile card, a wrist watch, a camera, an electric shaver, a cordless telephone, a facsimile machine, video equipment, a video camera, an electronic organizer, a calculator, an electronic organizer equipped with a communication function, a mobile copying machine, a liquid crystal television, an electric tool, a vacuum cleaner, a game machine equipped with a virtual reality function or the like, a toy, an electric bicycle, a walker for medical care, a wheelchair for medical care, a movable bed for medical care, an escalator, an elevators, a forklift, a golf cart, a backup power supply, a load conditioner, or a power storage system. In addition to consumer products, the conductive pattern can be used in military supplies and cosmic products.

What is claimed is:

1. A microscopic particle decentralized solution having decentralized microscopic particles with different diameters, wherein:

the microscopic particle decentralized solution has two peaks in a granularity distribution, at a large diameter and a small diameter;

microscopic particle mixtures satisfying the following relationships are decentralized in the solution;

$$R > r \text{ and } n > 3.84 \times (R/r)3 \times N,$$

where R is a large particle diameter, r is a small particle diameter, N is the number of large particles, and n is the number of small particle, wherein the large diameter particle and the small diameter particle are conductive material selected from a group consisting of Ag, Cu, Au, Pd, Pt, Ni, W, Mo, or Cr, or its oxide, or its alloy, and a decentralizer layer is formed on the surface of the small diameter particle.

2. A microscopic particle decentralized solution having decentralized microscopic particles with different diameters, wherein:

the microscopic particle decentralized solution has two peaks in a granularity distribution, at a large diameter and a small diameter;

microscopic particle mixtures satisfying the following relationships are decentralized in the solution;

$$R > r \text{ and } n > 3.84 \times (R/r)3 \times N,$$

where R is a large particle diameter, r is a small particle diameter, N is the number of large particles, and n is the number of small particle, wherein the large diameter particle and the small diameter particle are conductive, material selected from a group consisting of Ag, Cu, Au, Pd, Pt, Ni, W, Mo, or Cr, or its oxide, or its alloy, wherein the large diameter particle is a cluster of small diameter particles or the large diameter particle has a layer of small-diameter particles on the surface thereof, and a decentralizer layer is formed on the surface of the small diameter particle.

3. The microscopic particle decentralized solution according to claim 1, wherein the diameter of the small diameter particle is 100 nm or less.

4. The microscopic particle decentralized solution according to claim 1, wherein the solvent of the decentralized solution is a nonpolar solvent.

5. The microscopic particle decentralized solution according to claim 2, wherein the diameter of the small diameter particle is 100 nm or less.

* * * * *